United States Patent
Okuse et al.

(10) Patent No.: US 6,177,489 B1
(45) Date of Patent: *Jan. 23, 2001

(54) SEMICONDUCTOR ENCAPSULATING EPOXY RESIN COMPOSITION AND SEMICONDUCTOR DEVICE

(75) Inventors: Satoshi Okuse; Kazutoshi Tomiyoshi; Toshio Shiobara; Takayuki Aoki; Eiichi Asano; Shigeki Ino, all of Gunma-ken (JP)

(73) Assignee: Shin-Etsu Chemical Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/003,517

(22) Filed: Jan. 6, 1998

(30) Foreign Application Priority Data

Jan. 8, 1997 (JP) ................................. 9-013133

(51) Int. Cl.⁷ ...................... C08L 63/02; C08L 63/00; C08K 5/51
(52) U.S. Cl. .................... 523/451; 523/433; 523/435; 523/461; 524/129
(58) Field of Search .................... 523/433, 435, 523/451, 461; 524/128

(56) References Cited

U.S. PATENT DOCUMENTS

| | | | |
|---|---|---|---|
| 4,632,946 | * 12/1986 | Muench et al. ............ | 524/129 |
| 4,902,732 | * 2/1990 | Itoh et al. ............ | 523/433 |
| 5,290,882 | * 3/1994 | Shiobara et al. ............ | 523/433 |
| 5,360,837 | * 11/1994 | Honda et al. ............ | 523/443 |
| 5,434,199 | * 7/1995 | Gallagher et al. ............ | 523/443 |
| 5,443,872 | * 8/1995 | Akao et al. ............ | 428/35.7 |
| 5,476,884 | * 12/1995 | Kayaba et al. ............ | 523/443 |
| 5,567,749 | * 10/1996 | Sawamura et al. ............ | 523/443 |
| 5,578,660 | * 11/1996 | Fujita et al. ............ | 523/443 |
| 5,700,581 | * 12/1997 | Sachdev et al. ............ | 523/435 |
| 5,739,186 | * 4/1998 | Hayakawa et al. ............ | 523/443 |
| 5,798,400 | * 8/1998 | Tokunaga et al. ............ | 523/443 |
| 5,811,470 | * 9/1998 | Prindle, Jr. et al. ............ | 524/129 |
| 5,854,316 | * 12/1998 | Shimizu et al. ............ | 523/442 |

FOREIGN PATENT DOCUMENTS

| | | |
|---|---|---|
| 63-95249 | 4/1988 | (JP) . |
| 63-101454 | 5/1988 | (JP) . |
| 63-117057 | 5/1988 | (JP) . |
| 63-275661 | 11/1988 | (JP) . |
| 63-312349 | 12/1988 | (JP) . |

* cited by examiner

Primary Examiner—Tae Yoon

(57) ABSTRACT

A flame retardant epoxy resin composition suitable for semiconductor encapsulation contains (A) a crystalline epoxy resin whose 30 wt % m-cresol solution has a viscosity of lower than 80 centipoise at 25° C., (B) a curing agent having at least two phenolic hydroxyl groups, and (C) silica. The composition optionally contains (D) an organopolysiloxane, (E) an organic phosphine oxide, (F) an amide group-containing release agent, and/or (G) a silane coupling agent. The cured composition achieves flame retardance rating UL-94 V-0 without a need for flame retardants and remains stable at high temperature.

11 Claims, No Drawings

SEMICONDUCTOR ENCAPSULATING EPOXY RESIN COMPOSITION AND SEMICONDUCTOR DEVICE

BACKGROUND OF THE INVENTION

1. Field of the Invention

This invention relates to a flame retardant epoxy resin composition which is suitable for semiconductor encapsulation and when cured, meets the flame retardance rating UL-94 V-0 without a need for flame retardants and remains stable at high temperature. It also relates to a semiconductor device encapsulated with the composition.

2. Prior Art

With the advance of semiconductor devices toward higher density, surface mount packages now become the mainstream in; the semiconductor technology. Surface mount packages are exposed to high temperatures of 215 to 260° C. during mounting. Packages encapsulated with conventional encapsulants have the problems that separation can occur at the chip-encapsulant interface and cracks generate in the encapsulant portion. Thus reliability after mounting is not insured.

Under the circumstances, encapsulants comprising biphenyl type epoxy resins featuring low moisture absorption and reflow crack resistance are widely employed in these years.

As compared with the conventional encapsulants, these encapsulants comprising biphenyl type epoxy resins are superior in reflow crack resistance owing to low moisture absorption and low modulus at high temperature, but inferior in reliability tests such as a high-temperature residence test because of their extremely low glass transition temperature.

Defects are induced by high-temperature residence because intermetallic compounds form at the joints between aluminum electrodes and gold wires of IC during high-temperature residence. This results in an increased resistance and eventually the breakage of wires. It is known that the formation of such intermetallic compounds is accelerated by the presence of $Br^-$ and $Sb^{3+}$ in the resin composition as a flame retardant. It is a common practice to use a combination of a brominated epoxy resin and antimony trioxide as the flame retardant.

This indicates that the high-temperature capabilities are improved if the flame retardant is omitted. Conventional formulations, however, cannot meet certain flame retardant standards, for example, the rating V-0 of Underwriter's Laboratories UL-94 unless the flame retardant is added.

SUMMARY OF THE INVENTION

Therefore, an object of the invention is to provide a novel and improved flame retardant epoxy resin composition which is suitable for semiconductor encapsulation and when cured, meets the flame retardance rating UL-94 V-0 without a need for flame retardants and remains stable at high temperature. Another object of the invention is to provide a semiconductor device encapsulated with the cured composition.

We have found that an epoxy resin composition comprising (A) a crystalline epoxy resin whose solution in meta-cresol in a concentration of 30% by weight has a viscosity of lower than 80 centipoise at 25° C., (B) a curing agent having at least two phenolic hydroxyl groups in a molecule, and (C) silica can achieve the rating V-0 of the flame retardant standard UL-94 without a need for flame retardants including antimony trioxide and bromine compounds such as brominated epoxy resins. The composition remains stable when allowed to stand at high temperature. Then a semiconductor device encapsulated with a cured product of the composition is improved in high-temperature reliability. Advantageous results are obtained particularly when the epoxy resin does not contain a monovalent to tetravalent saturated aliphatic hydrocarbon structure having at least 3 carbon atoms in a molecule except for a closed or open ring glycidyl group, and the curing agent does not contain a monovalent to tetravalent saturated aliphatic hydrocarbon structure having at least 3 carbon atoms in a molecule.

Better results are obtained when the composition further contains at least one member of (D) an organopolysiloxane, (E) an organic phosphine oxide, (F) an amide group-containing release agent, and (G) an epoxy-free silane coupling agent.

In a first aspect, the present invention provides a semiconductor encapsulating epoxy resin composition comprising (A) an epoxy resin which is crystalline and exhibits a viscosity of lower than 80 centipoise at 25° C. when measured as a solution thereof in meta-cresol in a concentration of 30% by weight, (B) a curing agent having at least two phenolic hydroxyl groups in a molecule, the curing agent being present in such an amount that the molar ratio of the epoxy group in the epoxy resin to the phenolic hydroxyl group in the curing agent may range from 5/10 to 9/10, and (C) 89 to 92% by weight of the entire composition of silica.

In a second aspect, the present invention provides a semiconductor encapsulating epoxy resin composition comprising (A) an epoxy resin which is crystalline and exhibits a viscosity of lower than 80 centipoise at 25° C. when measured as a solution thereof in meta-cresol in a concentration of 30% by weight, (B) a curing agent having at least two phenolic hydroxyl groups in a molecule, the curing agent being present in such an amount that the molar ratio of the epoxy group in the epoxy resin to the phenolic hydroxyl group in the curing agent may range from 5/10 to 9/10, (C) 86 to 92% by weight of the entire composition of silica, and (D) an organopolysiloxane in an amount of 0.1 to 5 parts by weight per 100 parts by weight of the epoxy resin and the curing agent combined.

In a third aspect, the present invention provides a semiconductor encapsulating epoxy resin composition comprising (A) an epoxy resin which is crystalline and exhibits a viscosity of lower than 80 centipoise at 25° C. when measured as a solution thereof in meta-cresol in a concentration of 30% by weight, (B) a curing agent having at least two phenolic hydroxyl groups in a molecule, the curing agent being present in such an amount that the molar ratio of the epoxy group in the epoxy resin to the phenolic hydroxyl group in the curing agent may range from 5/10 to 9/10, (C) 87 to 92% by weight of the entire composition of silica, and (E) an organic phosphine oxide of the following general formula (2):

$$(O=PR^2{}_3)_n \quad (2)$$

wherein $R^2$ is independently a substituted or unsubstituted monovalent hydrocarbon group or two $R^2$ groups, taken together, forms a cyclic structure and letter n is equal to 1, 2 or 3, in an amount of 0.1 to 5 parts by weight per 100 parts by weight of the epoxy resin and the curing agent combined.

The composition may further contain (F) an amide group-containing release agent.

The composition may further contain (G) a silane coupling agent free of an epoxy group. Preferably, the epoxy resin does not contain a monovalent to tetravalent saturated aliphatic hydrocarbon structure having at least 3 carbon atoms in a molecule except for a closed or open ring glycidyl group, and the curing agent does not contain a monovalent to tetravalent saturated aliphatic hydrocarbon structure having at least 3 carbon atoms in a molecule.

Also contemplated herein is a semiconductor device encapsulated with a cured product of the epoxy resin composition defined above.

The epoxy resin composition of the invention exhibits high flame retardance although it does not contain conventional flame retardants such as antimony trioxide and bromine compounds, typically brominated epoxy resins. Even when left at high temperature for a certain period, a semiconductor device encapsulated with a cured product of the composition remains unaffected and reliable because the composition does not contain bromide and antimony ion sources which can promote the formation of intermetallic compounds. The epoxy resin composition of the invention is of great worth in the industry in that it does not contain antimony trioxide and bromine compounds which are detrimental to the human body and can pollute the environment.

DETAILED DESCRIPTION OF THE INVENTION

A first essential component, component (A), of the epoxy resin composition of the invention is an epoxy resin which is crystalline at room temperature (typically 25° C.). When the epoxy resin is dissolved in meta-cresol in a concentration of 30% by weight, the solution must have a viscosity of lower than 80 centipoise at 25° C., especially 30 to 75 centipoise at 25° C. Preferably the epoxy resin does not contain monovalent to tetravalent saturated aliphatic hydrocarbon structures having at least 3 carbon atoms in a molecule, except for a closed or open ring glycidyl group. Such saturated aliphatic hydrocarbon structures to be excluded are, for example, alkyl groups of at least 3 carbon atoms, di- to tetravalent alkylene groups of at least 3 carbon atoms, and cycloalkane structures of at least 3 carbon atoms, i.e., monovalent to tetravalent saturated aliphatic rings.

Epoxy resins whose m-cresol solution has a viscosity of lower than 80 centipoise allow for the high loading of silica and provide for compositions having a low moisture pickup and a low coefficient of linear expansion. These advantages are not obtained with epoxy resins whose m-cresol solution has a viscosity of higher than 80 centipoise. Those epoxy resins which have a viscosity of lower than 80 centipoise when measured as a m-cresol solution, but are not crystalline at room temperature are inferior in working efficiency and less dispersible with other components. Where an epoxy resin which contains in a molecule a monovalent to tetravalent saturated aliphatic hydrocarbon a structure having at least 3 carbon atoms, for example, alkyl groups, di- to tetravalent alkylene groups, and cycloalkane structures of at least 3 carbon atoms, other than a closed or open ring glycidyl group is used, the resulting composition would fail to meet the flame retardant rating UL-94 V-0 because of the high combustibility of such organic groups, unless flame retardants such as antimony trioxide and bromine compounds are added.

Illustrative, non-limiting, examples of the epoxy resin are given below.

OG: glycidoxy group

mp: melting point viscosity: centipoise (cp) measured as a 30 wt % m-cresol solution at 25° C.

ESLV-80XY (Shin-Nittetsu Chemical K.K.)

mp 78° C., viscosity 45 cp

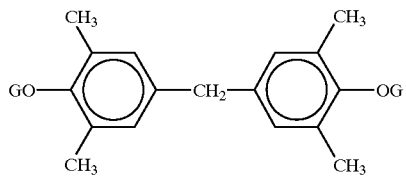

ESLV-80DE (Shin-Nittetsu Chemical K.K.)

mp 79° C., viscosity 36 cp

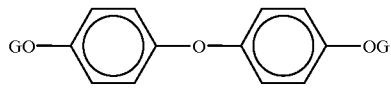

YX4000HK (Yuka Shell K.K.)

mp 105° C., viscosity 60 cp

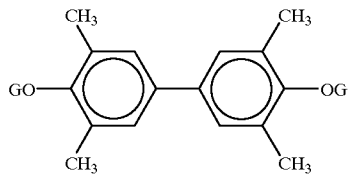

EBPS-300 (Nippon Kayaku K.K.)
mp 58° C., viscosity 70 cp

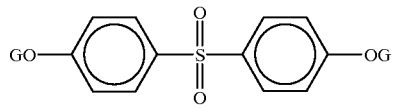

HP-4032H (Dai-Nihon Ink Chemical Industry K.K.)
mp 67° C., viscosity 65 cp

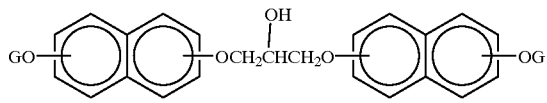

mp 152° C., viscosity 53 cp

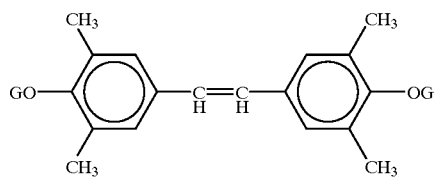

mp 90° C., viscosity 35 cp

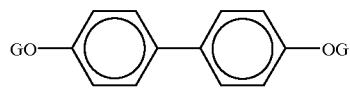

mp 110° C., viscosity 75 cp

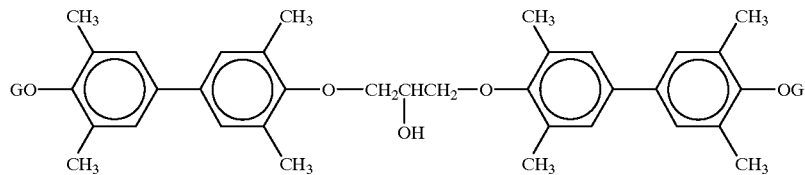

Among these, biphenyl type epoxy resins of the following general formula:

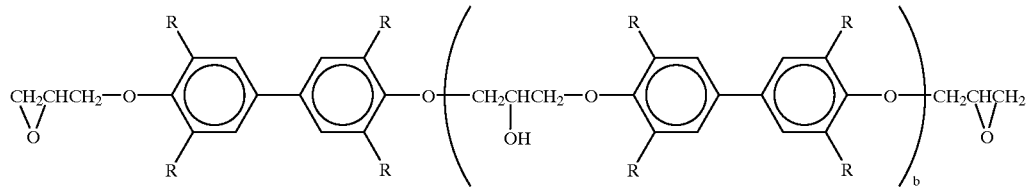

wherein R is hydrogen or methyl and letter b is an integer of 0 to 3 are desirable from the standpoints of low moisture pickup, thermal shock crack resistance after moisture pickup, fluidity, moldability, and curability.

A second essential component, component (B), of the epoxy resin composition of the invention is a curing agent having at least two phenolic hydroxyl groups in a molecule. The curing agent (B) is preferably selected from those compounds which have at least two phenolic hydroxyl groups in a molecule, but do not contain monovalent to tetravalent saturated aliphatic hydrocarbon structures having at least 3 carbon atoms, for example, alkyl groups, di- to tetravalent alkylene groups, and cycloalkane structures (i.e., monovalent to tetravalent saturated aliphatic rings) of at least 3 carbon atoms. Where a curing agent which contains in a molecule a monovalent to tetravalent saturated aliphatic hydrocarbon structure having at least 3 carbon atoms, for example, alkyl groups, di- to tetravalent alkylene groups, and cycloalkane structures of at least 3 carbon atoms is used, the resulting composition would fail to meet the flame retardant rating UL-94 V-0 because of the high combustibility of such organic groups, unless flame retardants such as antimony trioxide and bromine compounds are added. Examples of the curing agent include phenol novolak resins, cresol novolak resins, resol type phenolic resins, triphenol alkane type resins, polyfunctional phenolic resins, naphthalene ring-containing phenolic resins, phenol aralkyl resins, naphthol aralkyl resins, and biphenol resins. Phenol aralkyl resins are preferred among these. Exemplary phenol aralkyl resins are given below.

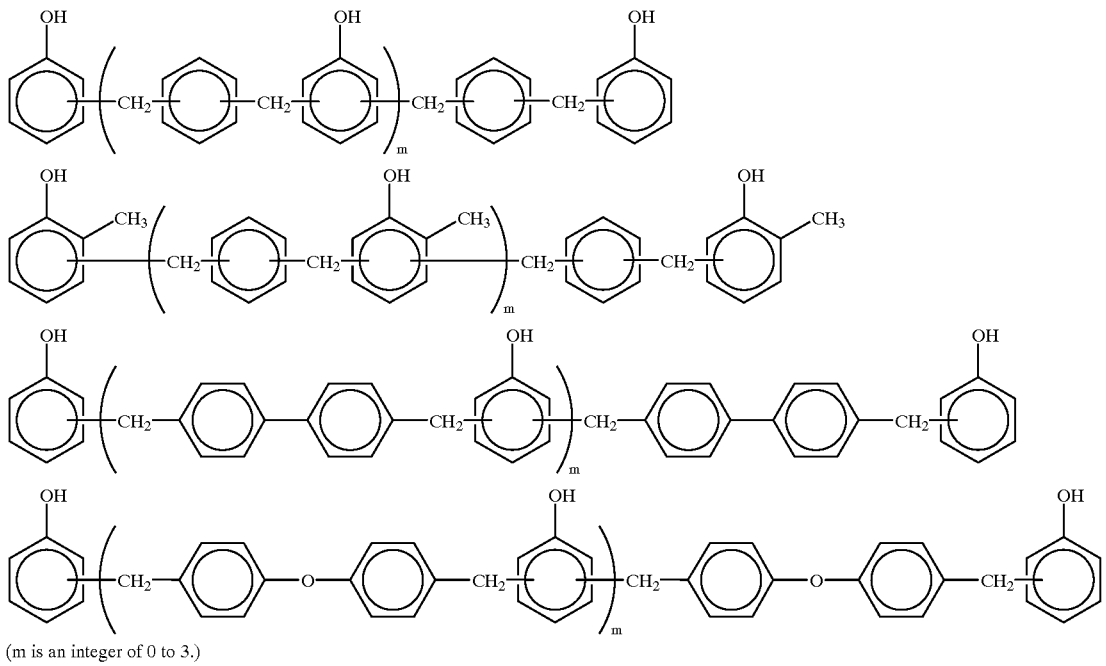

(m is an integer of 0 to 3.)

The phenol aralkyl resins represented by the above formulae may be used alone as a curing agent or combined with any of the other above-mentioned curing agents. In the latter case, the curing agent (mixture) should preferably contain at least 30%, especially at least 50% by weight of the phenol aralkyl resin represented by either of the above formulae. A curing agent containing less than 30% by weight of the phenol aralkyl resin curing agent would adversely affect fluidity and crack resistance.

The curing agent is contained in such an amount that the molar ratio of the epoxy group in the epoxy resin to the phenolic hydroxyl group in the curing agent (that is, moles of epoxy group per mole of phenolic hydroxyl group) may range from 5/10 to 9/10 (i.e., from 0.5 to 0.9), especially from 7/10 to 8/10 (i.e., from 0.7 to 0.8). A molar ratio in excess of 0.9 indicates that a highly combustible glycidyl derivative originating from the epoxy resin is present in the epoxy resin composition in such a proportion that the flame retardant rating UL-94 v-0 cannot be accomplished unless flame retardants such as antimony trioxide and bromine compounds are added. A molar ratio of less than 0.5 give rise to problems regarding molding and reliability.

A third essential component, component (C), of the epoxy resin composition of the invention is silica. Useful silica species include fused silica, ground silica, crystalline silica, amorphous silica, and quartz flour.

Silica is blended in an amount of 89 to 92%, preferably 90 to 91% by weight of the entire epoxy resin composition.

With a silica content of less than 89% by weight, the flame retardant rating UL-94 V-0 cannot be accomplished unless flame retardants such as antimony trioxide and bromine compounds are added. An epoxy resin composition with a silica content of more than 92% by weight would have a too high viscosity to mold. The silica used herein is not particularly limited in mean particle size and shape although spherical particles or mixtures of spherical particles and ground fragments having a mean particle size of 5 to 40 μm are preferred from the standpoints of molding and flow. The mean particle size may be measured, for example, as a weight-average value by a laser beam diffraction method.

In one preferred embodiment, the epoxy resin composition of the invention further contains (D) an organopolysiloxane compound. The organopolysiloxane used herein is preferably selected from silicone rubber and silicone resins in fine powder form and compounds of the following average compositional formula (1):

$$R^1_a SiO_{(4-a)/2} \tag{1}$$

wherein $R^1$ is a substituted or unsubstituted monovalent hydrocarbon group and letter a is a positive number from 0.8 to 3.

More particularly, in formula (1), O represents an oxygen atom forming a siloxane structure ($\equiv$Si—O—Si$\equiv$) in a molecule. $R^1$ is a substituted or unsubstituted monovalent hydrocarbon group attached to the silicon atom forming the siloxane structure. The unsubstituted monovalent hydrocarbon group preferably has 1 to 12, especially 1 to 8 carbon atoms. Examples of the unsubstituted monovalent hydrocarbon group represented by $R^1$ include alkyl groups such as methyl, ethyl, propyl, isopropyl, butyl, isobutyl, tert-butyl, pentyl, hexyl, cyclohexyl, and octyl, alkenyl groups such as vinyl, allyl, propenyl, butenyl, and hexenyl, aryl groups such as phenyl, tolyl, and naphthyl, and aralkyl groups such as benzyl, phenylethyl, and phenylpropyl. Examples of the substituted monovalent hydrocarbon group represented by $R^1$ include those of the foregoing hydrocarbon groups wherein some or all of the hydrogen atoms are replaced by halogen atoms such as fluorine and chlorine, cyano, hydroxy, alkoxy, amino, and mercapto groups, as well as monovalent hydrocarbon groups having a substituent or substituents selected from imino groups, epoxy groups, carboxyl groups, carbinol groups, (methyl)styryl groups, (meth)acryl groups, polyether groups, higher fatty acid groups, higher fatty acid ester groups, and long chain alkyl groups of at least 14 carbon atoms.

Letter a is a positive number from 0.8 to 3, preferably from 1 to 2.7.

The organopolysiloxane compounds of the average compositional formula (1) are classified into the following classes in terms of their structure.

Nonfunctional organopolysiloxane compounds which do not contain a monovalent hydrocarbon group having a functional substituent in a molecule include dimethylpolysiloxane and methylphenylpolysiloxane.

Modified organopolysiloxane compounds include amino-modified organopolysiloxanes, epoxy-modified organopolysiloxanes, carboxyl-modified organopolysiloxanes, carbinol-modified organopolysiloxanes, (meth)acryl-modified organopolysiloxanes, mercapto-modified organopolysiloxanes, phenol-modified organopolysiloxanes, one end reactive organopolysiloxanes, organopolysiloxanes modified with different functional groups, polyether-modified organopolysiloxanes, methylstyryl-modified organopolysiloxanes, long chain alkyl-modified organopolysiloxanes, higher fatty acid ester-modified organopolysiloxanes, higher fatty acid-containing organopolysiloxanes, and fluorine-modified organopolysiloxanes such as trifluoropropylmethylpolysiloxane. These organopolysiloxanes may have a linear, cyclic or branched molecular structure.

Organopolysiloxane resins are further classified into methylpolysiloxane resins and methylphenylpolysiloxane resins. The organopolysiloxane resins used herein may have a functional group such as silanol, hydroxy, carboxy, vinyl, amino, mercapto, epoxy, methoxy, and ethoxy groups in their structure. The methylpolysiloxane resins used herein include copolymers of three-dimensional network structure comprising a combination of $SiO_2$, $CH_3SiO_{3/2}$, $(CH_3)_2SiO$, and/or $(CH_3)_3SiO_{1/2}$ structural units. The methylphenylpolysiloxane resins used herein include copolymers of three-dimensional network structure comprising a combination of $SiO_2$, $CH_3SiO_{3/2}$, $C_6H_5SiO_{3/2}$, $(CH_3)_2SiO$, $(C_6H_5)_3SiO_{3/2}$, $(CH_3)_3SiO_{1/2}$, $(C_6H_5)(CH_3)SiO$, and/or $(C_6H_5)_2SiO$ structural units. They are more heat resistant than the methylpolysiloxane resins The organopolysiloxane compounds of the average compositional formula (1) should preferably have a degree of polymerization of about 5 to about 10,000, more preferably about 10 to about 5,000, especially about 20 to about 200. The degree of polymerization is the number of silicon atoms in a molecule. An organopolysiloxane with a degree of polymerization of less than 5 has a too low molecular weight and would give rise to the problems of volatility and compatibility. An organopolysiloxane with a degree of polymerization of more than 10,000 is too viscous and less dispersible.

In the practice of the invention, the organopolysiloxane (D) may be a cured one. In this regard, it may be properly selected from the following silicone rubbers and silicone resins. Included are organopolysiloxane rubbers cured through addition reaction in the presence of platinum catalysts, organopolysiloxane rubbers cured through condensation reaction (the condensation reaction includes dehydration, dehydrogenation, dealcoholysis, oxime removal, amine removal, amide removal, carboxylic acid removal and ketone removal), organopolysiloxane rubbers thermoset with organic peroxides, and organopolysiloxane rubbers cured by UV irradiation, as well as organopolysiloxane resins cured by each of the aforementioned reactions. These organopolysiloxane cured products are finely divided into powder by a suitable pulverizer before use. The organopolysiloxane cured products used herein may have a functional group such as silanol, hydroxy, carboxy, vinyl, amino, mercapto, epoxy, methoxy, and ethoxy groups in their structure. From the molding standpoint, the organopolysiloxane cured products used herein should preferably have a mean particle size of 0.01 to 50 $\mu$m, more preferably 0.1 to 20 $\mu$m because the molds used in the molding of ICs and other electronic parts are currently reduced in gate size as the packages becomes more compact and thinner. The mean particle size may be measured, for example, as a weight-average value by a laser beam diffraction method.

When the compatibility between the matrix resin (i.e., epoxy resin and phenol resin) and the organopolysiloxane is taken into account, modified organopolysiloxane compounds having high affinity to matrix resins are preferred among the aforementioned organopolysiloxane compounds used as component (D). Illustrative examples of the modified organopolysiloxane compound are polyether-modified organopolysiloxane compounds as shown below.

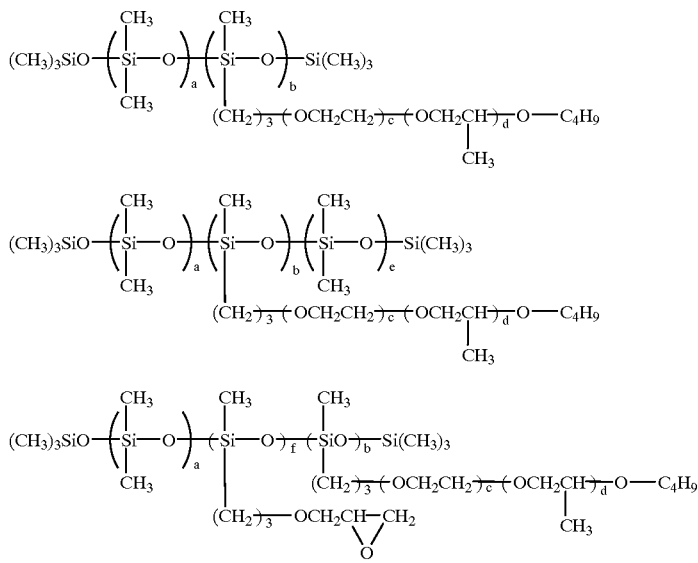

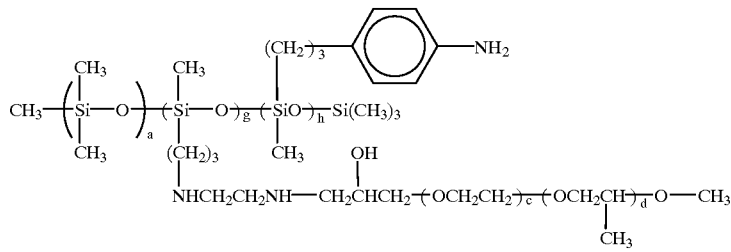

In the above formulae, letters a to h are integers, a is 5 to 200, b is 1 to 5, c is 0 to 30, d is 0 to 30, the sum of c and d is 10 to 60, e is 1 to 50, f is 1 to 5, g is 1 to 5, and h is 0 to 5.

Specific examples of the polyether-modified organopolysiloxane compound are given below.

It is also acceptable that the polyether-modified organopolysiloxane compound is used as a compatibilizing agent and another organopolysiloxane is used in combination. Such other organopolysiloxanes to be combined are amino- and epoxy-modified organopolysiloxanes containing an amino or epoxy functional group attached to a silicon atom at an end or intermediate of a molecular chain, examples of which are shown below.

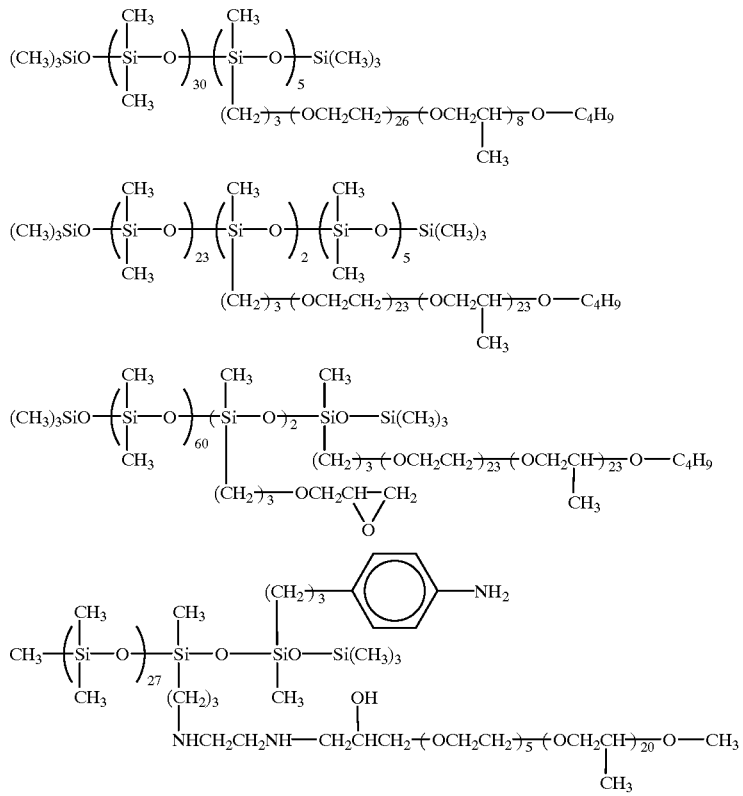

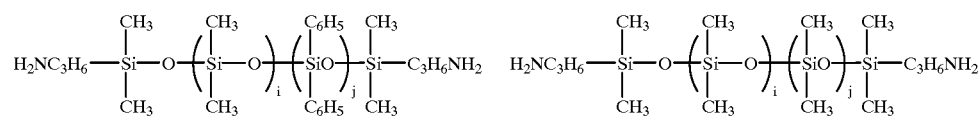

-continued

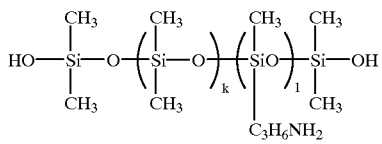
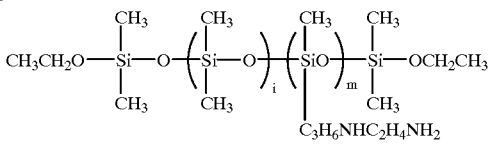
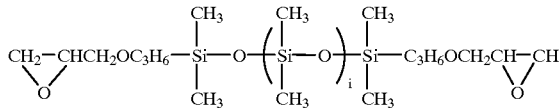
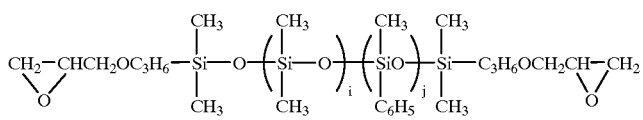
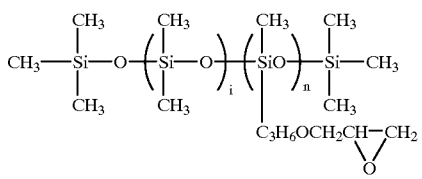

In the above formulae, letters i to n are integers, i is 5 to 200, j is 1 to 50, k is 50 to 2,000, l is 1 to 10, m is 1 to 10, and n is 1 to 10.

Specific examples of the amino- and epoxy-modified organopolysiloxanes are given below.

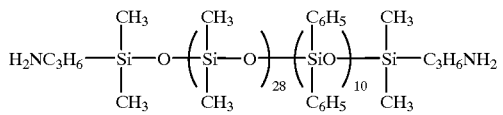
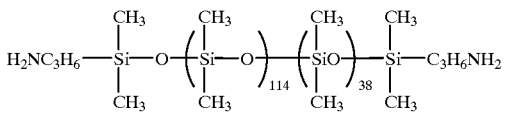
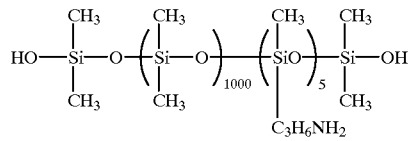
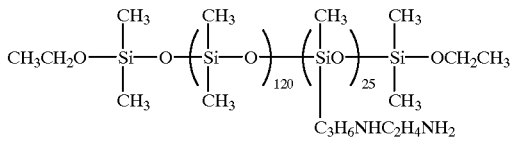
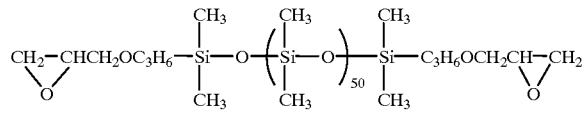
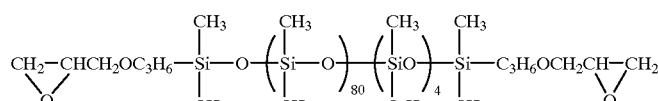
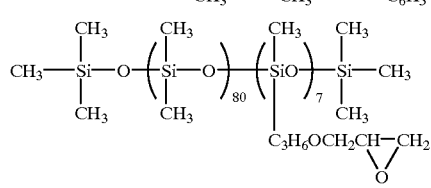

The manner of the organopolysiloxane compound exerting a flame retardant effect is explained as follows. By burning, an organopolysiloxane compound is decomposed into carbon dioxide, carbon monoxide, and water and leaves silica ($SiO_2$) as ash. In general, the burning state of an organopolysiloxane compound is distinguished from other oils, typically mineral oils by a smaller amount of gases given off and less combustion heat which leads to a smaller flame and retards flame propagation to the surroundings.

The use of organopolysiloxane compounds in flame retardant compositions is known in the art, for example, a combination of a vinyl-containing organopolysiloxane with a platinum compound in JP-B 2591/1969 corresponding to GB 1104606, a combination of an organopolysiloxane with a lead compound in JP-A 21449/1979 corresponding to CA 1110789, and a combination of an organopolysiloxane with a Group IIa metal salt of carboxylic acid in JP-A 241344/1986 corresponding to U.S. Pat. No. 4,273,691. For these combinations, the second component to be combined with the organopolysiloxane is essential. By adding the second component, flame retardance can be imparted at the sacrifice of reliability and other properties. In contrast, by adding an organopolysiloxane selected from conventional well-known organopolysiloxane compounds alone to a composition comprising components (A), (B), and (C), the present invention achieves the flame retardant rating UL-94 V-0 without a need for flame retardants such as antimony trioxide and bromine compounds.

The organopolysiloxane compound (D) is preferably added in an amount of about 0.1 to 5 parts, especially about 0.5 to 2 parts by weight per 100 parts by weight of the epoxy resin (A) and the curing agent (B) combined. Sometimes, less than 0.1 part of the organopolysiloxane would achieve little additive effect whereas more than 5 parts would detract from mechanical strength.

In the embodiment wherein the organopolysiloxane compound (D) is blended in the above-defined amount, it is preferred from the standpoint of achieving the flame retardant rating UL-94 V-0 to adjust the amount of silica (C) blended to the range of 86 to 92%, more preferably 89 to 92%, most preferably 90 to 91% by weight of the entire composition.

In another preferred embodiment, the epoxy resin composition of the invention further contains (E) an organic phosphine oxide compound of the following general formula (2):

wherein $R^2$ is independently a substituted or unsubstituted monovalent hydrocarbon group or two $R^2$ groups, taken together, forms a cyclic structure and letter n is equal to 1, 2 or 3.

The substituted or unsubstituted monovalent hydrocarbon groups represented by $R^2$ are preferably those of 1 to 10 carbon atoms, especially 1 to 6 carbon atoms. Examples of the unsubstituted monovalent hydrocarbon group are as described for $R^1$, and examples of the substituted monovalent hydrocarbon group are such groups having a halogen, cyano, hydroxy, alkoxy and ester substituent as described for $R^1$. Alternatively, two $R^2$ groups, taken together, may form a cyclic structure. That is, two $R^2$ groups are substituted or unsubstituted alkylene groups of 1 to 10 carbon atoms, preferably 2 to 6 carbon atoms having an end attached to the same or different phosphorus atoms, which are connected to form a cyclic structure. The substituted alkylene groups are those having a halogen, cyano, hydroxy or alkoxy substituent or substituents.

Illustrative examples of the organic phosphine oxide compound are given below where Ph is phenyl.

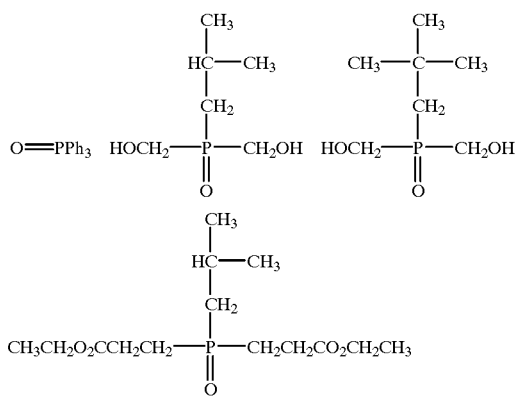

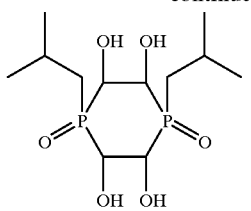

Among the aforementioned organic phosphine oxide compounds useful as component (E), triphenylphosphine oxide is most preferred because of stability, purity and availability.

The use of phosphorus compounds as the flame retardant is well known in the art, for example, the use of bisalkylvinylphosphonates as the flame retardant in JP-A 95249/1988, the use of halogenated phosphonophosphates as the flame retardant in JP-A 165423/1988 corresponding to EP 272482, the use of condensed aluminum phosphate as the flame retardant in JP-A 101454/1988, the use of aromatic phosphates and aromatic polyphosphates as the flame retardant in JP-A 117057/1988, the use of metal salts of N-substituted amide phosphoric acid diesters as the flame retardant in JP-A 312349/1988, the use of mixtures of a phosphate ester and a phosphate compound as the flame retardant in JP-A 275661/1988, the use of red phosphorus flame retardants in JP-A 4632/1989, the use of mixtures of a hydroxy-containing phosphine oxide and a brominated resin as the flame retardant in U.S. Pat. No. 5,084,546, and the use of organophosphorus compounds as the flame retardant in EP 742261A, U.S. Pat. No. 5,506,313 and EP 539327.

The use of the foregoing phosphate esters as the flame retardant for semiconductor encapsulating resin compositions, however, would give rise to a problem of reliability, especially reliability with respect to heat resistance and moisture resistance because the phosphate esters themselves have high acidity and can hydrolyze into highly acidic phosphoric acid. Some phosphate esters are toxic and thus undesirable from the environmental aspect. When a mixture of a phosphine oxide and a brominated resin is used, the resulting composition would be less reliable because the composition contains a bromide ion source which can detract from heat resistance and moisture resistance.

In contrast, by adding an organic phosphine oxide of formula (2) as a sole flame retardant to a composition comprising components (A), (B), and (C), the present invention achieves the flame retardant rating UL-94 V-0 at no sacrifice of reliability, especially reliability with respect to heat resistance and moisture resistance and without a need for flame retardants such as antimony trioxide and bromine compounds.

The organic phosphine oxide compound (E) is preferably added in an amount of about 0.1 to 5 parts, especially about 1 to 3 parts by weight per 100 parts by weight of the epoxy resin (A) and the curing agent (B) combined. Sometimes, less than 0.1 part of the organic phosphine oxide would achieve little flame retardant effect whereas more than 5 parts would detract from mechanical strength and reliability.

In the embodiment wherein the organic phosphine oxide compound (E) is blended in the above-defined amount, it is preferred from the standpoint of achieving the flame retardant rating UL-94 V-0 to adjust the amount of silica (C) blended to the range of 87 to 92%, more preferably 89 to 92%, most preferably 90 to 91% by weight of the entire composition.

In a further preferred embodiment, the epoxy resin composition of the invention further contains (F) an amide group-containing release agent. The amide group-containing release agent (F) is preferably of the following general formula (3) or (4):

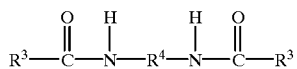
(3)

(4)

wherein $R^3$ is a monovalent hydrocarbon group of 10 to 30 carbon atoms, $R^4$ is a divalent hydrocarbon group of 1 to 4 carbon atoms, and $R^5$ is a hydrogen atom or monovalent hydrocarbon group of 10 to 30 carbon atoms.

The monovalent hydrocarbon groups of 10 to 30 carbon atoms represented by $R^3$ and $R^5$ are preferably alkyl groups, especially alkyl groups of 14 to 26 carbon atoms. The divalent hydrocarbon group of 1 to 4 carbon atoms represented by $R^4$ are typically alkylene groups such as methylene, ethylene, propylene, and butylene.

Illustrative examples of the amide group-containing release agents of formulae (3) and (4) are given below.

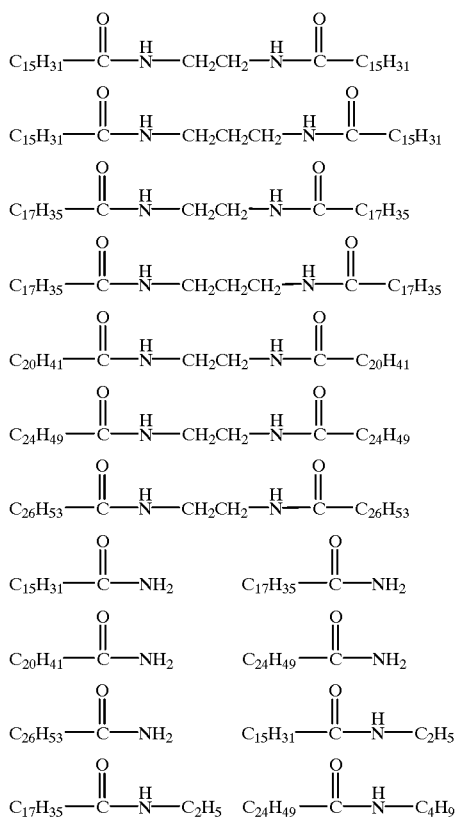

The mold release agent (F) is preferably added in an amount of about 0.5 to 3 parts, especially about 1 to 2 parts by weight per 100 parts by weight of the epoxy resin (A) and the curing agent (B) combined. Sometimes, less than 0.5 part of the mold release agent would achieve little mold release effect whereas more than 3 parts would cause the exudation of the release agent to the molded surface and adversely affect the adhesion of the composition to silicon chips and die pads.

The amide group-containing release agents used herein are superior in flame retardance to the commonly used mold release agents such as carnauba wax, higher fatty acids, higher fatty acid esters, and synthetic wax. The reason why the amide group-containing release agents used herein provide superior flame retardance is that the high cohesive energy of amide group and the high hydrogen bond force of NH group improve pyrolytic resistance, which results in superior flame retardance.

In a still further preferred embodiment, the epoxy resin composition of the invention further contains (G) a silane coupling agent free of an epoxy group. The silane coupling agent (G) is preferably of the following general formula (5):

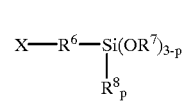
(5)

wherein X is a monovalent functional group selected from hydroxyl, thiol, amino, and substituted amino groups, $R^6$ is a substituted or unsubstituted divalent hydrocarbon group of 1 to 15 carbon atoms, $R^7$ and $R^8$ are independently monovalent hydrocarbon groups of 1 to 6 carbon atoms, and letter p is equal to 0, 1 or 2.

X represents functional groups as mentioned above, among which the substituted amino groups are amino groups wherein one or two hydrogen atoms attached to the nitrogen atom ($H_2N-$) are replaced by monovalent hydrocarbon groups of 1 to 15 carbon atoms, that is, groups of $R^9{}_2N-$ wherein $R^9$, which may be identical or different, is hydrogen or a monovalent hydrocarbon group of 1 to 10 carbon atoms. The monovalent hydrocarbon groups represented by $R^9$ are preferably those groups free of an aliphatic unsaturated group, for example, alkyl groups such as methyl, ethyl, propyl, butyl, hexyl, and cyclohexyl, aryl groups such as phenyl and tolyl, and aralkyl groups such as benzyl and phenylethyl.

$R^6$ represents divalent hydrocarbon groups of 1 to 15 carbon atoms, for example, normal or branched alkylene groups such as methylene, ethylene, propylene, butylene, and methylethylene, arylene groups such as phenylene and naphthalene, alkyl-substituted arylene groups such as tolylene, dimethylphenylene, and methylnaphthalene, and (alkyl-substituted) arylene-alkylene groups obtained by combining some of the foregoing groups. The divalent hydrocarbon groups of 1 to 15 carbon atoms may also be substituted divalent hydrocarbon groups having at least one element intervening in their alkylene chain. Exemplary intervening elements are ether atoms such as oxygen and sulfur, thioether atoms, and substituted or unsubstituted imino groups such as NH and $NR^9$. The group $X-R^6-$ may also be a monovalent group having an alkylene diamino structure or alkylene thioamino structure of the following formulae:

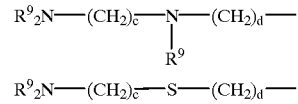

wherein letters c and d are integers, c is at least 1, d is at least one, and the sum of c and d is from 2 to 15.

The monovalent hydrocarbon groups of 1 to 6 carbon atoms represented by $R^7$ and $R^8$ are unsubstituted ones, for example, alkyl groups such as methyl, ethyl, propyl, and butyl, alkenyl groups such as vinyl, allyl, propenyl, and butenyl, and aryl groups such as phenyl. Also included are substituted monovalent hydrocarbon groups, for example, halogen-substituted alkyl groups such as fluorine and chlorine-substituted ones, and alkoxy-substituted alkyl groups such as methoxymethyl, methoxyethyl, ethoxymethyl, and ethoxyethyl.

Illustrative examples of the silane coupling agent are given below.

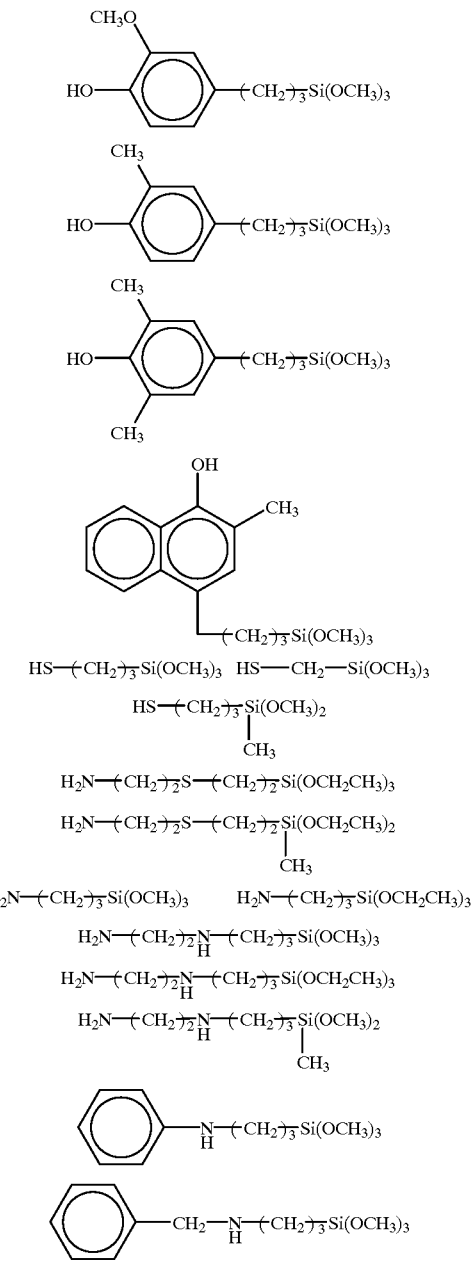

The silane coupling agent (G) is preferably added in an amount of about 0.1 to 3 parts, especially about 0.5 to 2 parts by weight per 100 parts by weight of the epoxy resin (A) and the curing agent (B) combined. Sometimes, less than 0.1 part of the silane coupling agent would be less effective for improving the adhesion and moisture resistant reliability of a cured product of an epoxy resin composition. More than 3 parts would cause to stain the mold when semiconductor devices are encapsulated with an epoxy resin composition.

The silane coupling agent free of an epoxy group (G) used herein provides superior flame retardance to silane coupling agents having an epoxy group. If a silane coupling agent having an epoxy group is blended in an epoxy resin composition, the composition cannot achieve the flame retardant rating UL-94 V-0 unless flame retardants such as antimony trioxide and bromine compounds are added. This is because a highly combustible glycidyl derivative derived from the epoxy group is present in the composition in a considerable amount.

A curing promoter may be added to the epoxy resin composition of the invention. Exemplary curing promoters are imidazoles and derivatives thereof, phosphine derivatives, and cycloamidine derivatives. The amount of curing promoter added is preferably 0.01 to about 5 parts, more preferably 0.1 to about 2.5 parts by weight per 100 parts by weight of the epoxy resin. Less than 0.01 part of the curing promoter would not be effective for brief curing whereas more than 5 parts would result in a too high curing rate to produce satisfactory molded parts.

If desired, conventional mold release agents other than component (F) such as carnauba wax, higher fatty acids, and synthetic wax are blended in the composition of the invention. Various other additives may be added to the composition of the invention insofar as the objects of the invention are not impaired. As is well known in the art, flame retardants including antimony compounds such as antimony trioxide and bromine compounds such as brominated epoxy resins are conventionally blended. It is acceptable that conventional flame retardants be blended in the inventive composition in such an amount that they may not adversely affect the physical properties (other than flame retardance) of a cured product of the inventive composition and the surrounding environment, although a cured product of the inventive composition can achieve the flame retardant rating UL-94 V-0 without a need for the conventional flame retardants.

The composition of the invention can be prepared by mixing the above-mentioned essential and optional components, for example, by melt mixing in a heating roll mill, kneader or continuous extruder.

The epoxy resin composition of the invention is applicable to semiconductor packages including dual inline packages (DIP), flat packages, plastic leaded chip carriers (PLCC) and small outline packages (SOP). The composition can be molded by conventional molding techniques such as transfer molding, injection molding, and casting, preferably at a temperature of about 150 to 180° C. Post curing is effected at about 150 to 185° C. for about 2 to about 16 hours.

There has been described a flame retardant epoxy resin composition which meets the flame retardance rating UL-94 V-0 without a need for conventional flame retardants and remains stable at high temperature. A semiconductor device encapsulated with the cured composition is improved in flame retardance and high-temperature residence stability and thus remains highly reliable.

EXAMPLE

Examples of the present invention are given below by way of illustration and not by way of limitation. All parts are by weight. Abbreviation "mp" is a melting point, "bp" is a boiling point, and "sp" is a softening point. Certain terms in Tables 1 through 10 have the following meaning.

"UM" means unmeasurable because a test bar could not be molded.

Silane coupling agent (1) is 3-phenylaminopropyltrimethoxysilane having a boiling point of 312° C. commercially available under the trade name KBM-573 from Shin-Etsu Chemical Co., Ltd.

Kao Wax EBF is a wax available from Kao K.K. (see Examples 28–34).

Examples 1–6 and Comparative Examples 1–9

Epoxy resin compositions were prepared by using an epoxy resin and a phenolic resin (shown below) in amounts as shown in Tables 1 and 2, blending fused silica therewith in proportions as shown in Tables 1 and 2, adding thereto 1.2 parts of ethylene bisstearoformamide as a release agent, 2.0 parts of carbon black, 1.5 parts of silane coupling agent (1) (KBM-573), and 1 part of triphenylphosphine, and uniformly melt milling the mixture in a hot twin-roll mill.

Epoxy resin:

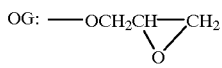

|   |   | Epoxy equivalent | mp (° C.) | Viscosity (cp) |
|---|---|---|---|---|
| (1) | YX-4000<br>Yuka Shell K.K. | 190 | 105 | 60 |
| (2) | ESLV-80XY<br>Shin-Nittetsu Chemical K.K. | 192 | 78 | 45 |
| (3) | ESLV-80DE<br>Shin-Nittetsu Chemical K.K. | 192 | 79 | 36 |
| (4) | EOCN-4400<br>Nippon Kayaku K.K. | 190 | 62 | 98 |
| (5) | EXA-7200<br>Dai-Nihon Ink Chemical Industry K.K. | 247 | 54 | 42 | n = 0 - 1

-continued

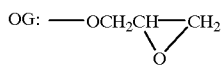

|   |   | Epoxy equivalent | mp (° C.) | Viscosity (cp) |
|---|---|---|---|---|
| (6) | brominated epoxy resin AER-8049 Asahi Chemicals K.K. | 459 | 82 | — |

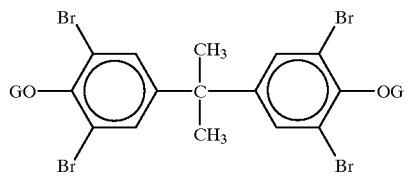

The viscosity is a measurement of a solution of an epoxy resin in meta-cresol in a concentration of 30% by weight at 25° C.

Curing agent:

|   |   | OH equivalent | sp (° C.) |
|---|---|---|---|
| (1) | MEH-7800 Meiwa Chemicals K.K. | 175 | 80 |

[structure: phenol-CH2-phenol-CH2-phenol-CH2-phenol-CH2-phenol, each phenol with OH]

| (2) | DPR-5000 Mitsui-Toatsu Chemistry K.K. | 180 | 100 |

[structure with n = 0 - 20]

| (3) | R-3 Meiwa Chemicals K.K. | 111 | 114 |

[structure: HO-phenyl-CH(CH3)CH2CH(phenyl-OH)(phenyl-OH) type]

Each of the epoxy resin compositions was measured for various properties. The results are shown in Tables 1 and 2.

(i) Spiral flow

Using a mold as prescribed by the EMMI standard, spiral flow was measured at 175° C. and 70 kg/cm².

(ii) Flame retardance

A test bar of 127×12.7×1.6 mm was subjected to the test procedure set forth in Underwriters' Laboratories, Inc. Bulletin 94, Burning test for classifying materials (UL-94). The test bar was examined whether or not it passed the rating UL-94 V-0.

(iii) Molding

The test piece used was a 14-pin DIP having a simulative aluminum element. An epoxy resin composition was molded over the test piece at a temperature of 175° C. and a pressure of 70 kg/cm² for 2 minutes. The thus molded package was examined for defects including external voids, internal voids and short filling. The sample was rated "passed" when no defects were found and "rejected" when defects were found.

(iv) Heat resistance (n=20)

The package molded as above was allowed to stand at 200° C. for 1,000 hours before it was examined for defects as above. Only those epoxy resin compositions which passed the flame retardance test (UL-94 V-O) and the molding test were subjected to the heat resistance test.

TABLE 1

|  | Example | | | | | |
| --- | --- | --- | --- | --- | --- | --- |
|  | 1 | 2 | 3 | 4 | 5 | 6 |
| Composition (pbw) | | | | | | |
| Epoxy resin (1) | 43.2 | 46.5 | 46.5 | 46.5 | — | — |
| Epoxy resin (2) | — | — | — | — | 46.7 | — |
| Epoxy resin (3) | — | — | — | — | — | 46.7 |
| Curing agent (1) | 56.8 | 53.5 | 53.5 | 53.5 | 53.3 | 53.3 |
| Molar ratio (epoxy/OH) | 0.7 | 0.8 | 0.8 | 0.8 | 0.8 | 0.8 |
| Fused silica content (wt %) | 90 | 89 | 90 | 92 | 90 | 90 |
| Carbon black | 2 | 2 | 2 | 2 | 2 | 2 |
| Silane coupling agent (1) | 1.5 | 1.5 | 1.5 | 1.5 | 1.5 | 1.5 |
| Ethylene bisstearo-formamide | 1.2 | 1.2 | 1.2 | 1.2 | 1.2 | 1.2 |
| Triphenyl-phosphine | 1 | 1 | 1 | 1 | 1 | 1 |
| Properties | | | | | | |
| Spiral flow (cm) | 67 | 85 | 71 | 62 | 83 | 88 |
| UL-94 V-0 | passed | passed | passed | passed | passed | passed |
| Molding | passed | passed | passed | passed | passed | passed |
| Heat resistance | 0/20 | 0/20 | 0/20 | 0/20 | 0/20 | 0/20 |

TABLE 2

|  | Comparative Example | | | | | | | | |
| --- | --- | --- | --- | --- | --- | --- | --- | --- | --- |
|  | 1 | 2 | 3 | 4 | 5 | 6 | 7 | 8 | 9 |
| Composition (pbw) | | | | | | | | | |
| Epoxy resin (1) | 46.5 | 46.5 | 57.6 | 30.3 | 45.8 | 57.8 | — | — | 49.8 |
| Epoxy resin (4) | — | — | — | — | — | — | 46.5 | — | — |
| Epoxy resin (5) | — | — | — | — | — | — | — | 53 | — |
| Curing agent (1) | 53.5 | 53.5 | 42.4 | 69.7 | — | — | 53.5 | 47 | 44 |
| Curing agent (2) | — | — | — | — | 54.2 | — | — | — | — |
| Curing agent (3) | — | — | — | — | — | 42.2 | — | — | — |
| Brominated epoxy resin (6) | — | — | — | — | — | — | — | — | 6.2 |
| Molar ratio (epoxy/OH) | 0.8 | 0.8 | 1.2 | 0.4 | 0.8 | 0.8 | 0.8 | 0.8 | 1.05 |
| Antimony trioxide | — | — | — | — | — | — | — | — | 8 |
| Fused silica content (wt %) | 88 | 93 | 90 | 90 | 90 | 90 | 90 | 90 | 90 |
| Carbon black | 2 | 2 | 2 | 2 | 2 | 2 | 2 | 2 | 2 |
| Silane coupling agent (1) | 1.5 | 1.5 | 1.5 | 1.5 | 1.5 | 1.5 | 1.5 | 1.5 | 1.5 |
| Ethylene bisstearoformamide | 1.2 | 1.2 | 1.2 | 1.2 | 1.2 | 1.2 | 1.2 | 1.2 | 1.2 |
| Triphenylphosphine | 1 | 1 | 1 | 1 | 1 | 1 | 1 | 1 | 1 |
| Properties | | | | | | | | | |
| Spiral flow (cm) | 110 | 7 | 75 | 41 | 60 | 53 | 33 | 73 | 80 |
| UL-94 V-0 | rejected | UM rejected | rejected | passed | rejected | rejected | passed | rejected | passed |
| Molding | passed | rejected | passed | rejected | passed | passed | rejected | passed | passed |
| Heat resistance | — | — | — | — | — | — | — | — | 20/20 |

Examples 7–18 and Comparative Examples 10–18

Epoxy resin compositions were prepared by uniformly melt mixing the components shown in Tables 3 and 4 in a hot twin-roll mill. The organopolysiloxanes used are shown below.

Organopolysiloxane:
(1) KF96 by Shin-Etsu Chemical Co., Ltd.
  dimethylpolysiloxane blocked with a trimethylsilyl group at each end of its molecular chain
(2) X-22–161 by Shin-Etsu Chemical Co., Ltd.
  dimethylpolysiloxane modified with an amino group at each end
(3) X-22-3939A by Shin-Etsu Chemical Co., Ltd.
  dimethylpolysiloxane modified with an amino-containing polyether
(4) KR213 by Shin-Etsu Chemical Co., Ltd.
  methylpolysiloxane resin, methoxy group equivalent 160
(5) X-52-874C by Shin-Etsu Chemical Co., Ltd.
  cured dimethylpolysiloxane powder, mean particle size 10–15 $\mu$m The thus obtained epoxy resin compositions were subjected to the tests (i) to (iii) and another heat resistance test (v). The results are shown in Tables 3 and 4.

(v) Heat resistance test (n=20)

Using a gold wire of 30 $\mu$m thick, a simulative element having aluminum conductors formed on a silicon chip and a partially gold-plated 42 alloy frame were bonded. An epoxy resin composition was molded over the test piece at a temperature of 175° C. and a pressure of 70 kg/cm$^2$ for 2 minutes, obtaining a 14-pin DIP. The molded package was post cured at 180° C. for 4 hours and allowed to stand in a dryer at 200° C. for a predetermined time of 168 hours. Thereafter the cured resin was dissolved away with fuming nitric acid. The bonded portion on the chip was measured for shear strength. When the shear strength was less than ½ of the initial strength, that sample was regarded "irejected." Only those epoxy resin compositions which passed the flame retardance test (UL-94 V-0) and the molding test were subjected to the heat resistance test.

TABLE 3

| | Example | | | | | | | | | | | |
|---|---|---|---|---|---|---|---|---|---|---|---|---|
| | 7 | 8 | 9 | 10 | 11 | 12 | 13 | 14 | 15 | 16 | 17 | 18 |
| Composition (pbw) | | | | | | | | | | | | |
| Epoxy resin (1) | 43.2 | 49.4 | 46.5 | 46.5 | 46.5 | 46.5 | 46.5 | 46.5 | 46.5 | 46.5 | — | — |
| Epoxy resin (2) | — | — | — | — | — | — | — | — | — | — | 46.7 | — |
| Epoxy resin (3) | — | — | — | — | — | — | — | — | — | — | — | 46.7 |
| Curing agent (1) | 56.8 | 50.6 | 53.5 | 53.5 | 53.5 | 53.5 | 53.5 | 53.5 | 53.5 | 53.5 | 53.5 | 53.5 |
| Molar ratio (epoxy/OH) | 0.7 | 0.9 | 0.8 | 0.8 | 0.8 | 0.8 | 0.8 | 0.8 | 0.8 | 0.8 | 0.8 | 0.8 |
| Fused silica content (wt %) | 89 | 90 | 86 | 87 | 89 | 89 | 89 | 89 | 89 | 92 | 89 | 89 |
| Carbon black | 2 | 2 | 2 | 2 | 2 | 2 | 2 | 2 | 2 | 2 | 2 | 2 |
| Organopoly-siloxane (1) | — | — | — | — | 1 | — | — | — | — | — | — | — |
| Organopoly-siloxane (2) | — | — | — | — | — | 1 | — | — | — | — | — | — |
| Organopoly-siloxane (3) | 1 | 1 | 1 | 2 | — | — | 1 | — | — | 0.5 | 1 | 1 |
| Organopoly-siloxane (4) | — | — | — | — | — | — | — | 1 | — | — | — | — |
| Organopoly-siloxane (5) | — | — | — | — | — | — | — | — | 1 | — | — | — |
| Silane coupling agent (1) | 1.5 | 1.5 | 1.5 | 1.5 | 1.5 | 1.5 | 1.5 | 1.5 | 1.5 | 1.5 | 1.5 | 1.5 |
| Kao Wax EBF | 1.2 | 1.2 | 1.2 | 1.2 | 1.2 | 1.2 | 1.2 | 1.2 | 1.2 | 1.2 | 1.2 | 1.2 |
| Triphenyl-phosphine | 1 | 1 | 1 | 1 | 1 | 1 | 1 | 1 | 1 | 1 | 1 | 1 |
| Triphenyl-phosphine oxide | — | — | 3 | — | — | — | — | — | — | — | — | — |
| Properties | | | | | | | | | | | | |
| Spiral flow (cm) | 75 | 81 | 110 | 113 | 92 | 84 | 95 | 80 | 75 | 72 | 102 | 111 |
| UL-94 V-0 | passed | passed | passed | passed | passed | passed | passed | passed | passed | passed | passed | passed |
| Molding | passed | passed | passed | passed | passed | passed | passed | passed | passed | passed | passed | passed |
| Heat resistance | 0/20 | 0/20 | 0/20 | 0/20 | 0/20 | 0/20 | 0/20 | 0/20 | 0/20 | 0/20 | 0/20 | 0/20 |

TABLE 4

| | Comparative Example | | | | | | | | |
|---|---|---|---|---|---|---|---|---|---|
| | 10 | 11 | 12 | 13 | 14 | 15 | 16 | 17 | 18 |
| Composition (pbw) | | | | | | | | | |
| Epoxy resin (1) | 46.5 | 46.5 | 57.6 | 30.3 | 45.8 | 57.8 | — | — | 49.8 |
| Epoxy resin (4) | — | — | — | — | — | — | 46.5 | — | — |
| Epoxy resin (5) | — | — | — | — | — | — | — | 53 | — |
| Curing agent (1) | 53.5 | 53.5 | 42.4 | 69.7 | — | — | 53.5 | 47 | 44 |
| Curing agent (2) | — | — | — | — | 54.2 | — | — | — | — |
| Curing agent (3) | — | — | — | — | — | 42.2 | — | — | — |
| Brominated epoxy resin (6) | — | — | — | — | — | — | — | — | 6.2 |
| Molar ratio (epoxy/OH) | 0.8 | 0.8 | 1.2 | 0.4 | 0.8 | 0.8 | 0.8 | 0.8 | 1.05 |
| Antimony trioxide | — | — | — | — | — | — | — | — | 8 |
| Fused silica content (wt %) | 85 | 93 | 89 | 89 | 89 | 89 | 89 | 89 | 89 |
| Carbon black | 2 | 2 | 2 | 2 | 2 | 2 | 2 | 2 | 2 |
| Organopoly-siloxane (3) | 5 | 0.5 | 5 | 1 | 1 | 1 | 1 | 1 | — |
| Silane coupling agent (1) | 1.5 | 1.5 | 1.5 | 1.5 | 1.5 | 1.5 | 1.5 | 1.5 | 1.5 |
| Kao Wax EBF | 1.2 | 1.2 | 1.2 | 1.2 | 1.2 | 1.2 | 1.2 | 1.2 | 1.2 |
| Triphenylphosphine | 1 | 1 | 1 | 1 | 1 | 1 | 1 | 1 | 1 |
| Properties | | | | | | | | | |
| Spiral flow (cm) | 131 | 7 | 122 | 43 | 73 | 59 | 42 | 86 | 92 |
| UL-94 V-0 | rejected | UM | rejected | passed | rejected | rejected | passed | rejected | passed |
| Molding | passed | rejected | passed | rejected | passed | passed | rejected | passed | passed |
| Heat resistance | — | — | — | — | — | — | — | — | 20/20 |

Examples 19–27 and Comparative Examples 19–27

Epoxy resin compositions were prepared by uniformly melt mixing the components shown in Tables 5 and 6 in a hot twin-roll mill. The organic phosphine oxides used are shown below.

Organic phosphine oxide:

(1) triphenylphosphine oxide, mp 154–155° C.
(2) CYAGARD RF 1204, Citex-Ind.

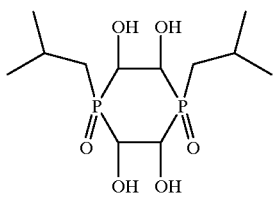

(3) mp 150–152° C.

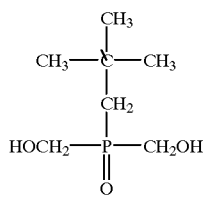

The thus obtained epoxy resin compositions were subjected to the tests (i) to (iii) and (v). The results are shown in Tables 5 and 6.

TABLE 5

| | Example | | | | | | | | |
|---|---|---|---|---|---|---|---|---|---|
| | 19 | 20 | 21 | 22 | 23 | 24 | 25 | 26 | 27 |
| Composition (pbw) | | | | | | | | | |
| Epoxy resin (1) | 43.2 | 49.4 | 46.5 | 46.5 | 46.5 | 46.5 | 46.5 | — | — |
| Epoxy resin (2) | — | — | — | — | — | — | — | 46.7 | — |
| Epoxy resin (3) | — | — | — | — | — | — | — | — | 46.7 |
| Curing agent (1) | 56.8 | 50.6 | 53.5 | 53.5 | 53.5 | 53.5 | 53.5 | 53.3 | 53.3 |
| Molar ratio (epoxy/OH) | 0.7 | 0.9 | 0.8 | 0.8 | 0.8 | 0.8 | 0.8 | 0.8 | 0.8 |
| Fused silica content (wt %) | 89 | 90 | 87 | 89 | 89 | 89 | 92 | 89 | 89 |

TABLE 5-continued

| | Example | | | | | | | | |
|---|---|---|---|---|---|---|---|---|---|
| | 19 | 20 | 21 | 22 | 23 | 24 | 25 | 26 | 27 |
| Carbon black | 2 | 2 | 2 | 2 | 2 | 2 | 2 | 2 | 2 |
| Organic phosphine oxide (1) | 3 | 3 | 4 | 3 | — | — | 1 | 3 | 3 |
| Organic phosphine oxide (2) | — | — | — | — | 3 | — | — | — | — |
| Organic phosphine oxide (3) | — | — | — | — | — | 3 | — | — | — |
| Silane coupling agent (1) | 1.5 | 1.5 | 1.5 | 1.5 | 1.5 | 1.5 | 1.5 | 1.5 | 1.5 |
| Kao Wax EBF | 1.2 | 1.2 | 1.2 | 1.2 | 1.2 | 1.2 | 1.2 | 1.2 | 1.2 |
| Triphenylphosphine | 1 | 1 | 1 | 1 | 1 | 1 | 1 | 1 | 1 |
| Properties | | | | | | | | | |
| Spiral flow (cm) | 81 | 86 | 121 | 102 | 78 | 93 | 83 | 109 | 120 |
| UL-94 V-0 | passed | passed | passed | passed | passed | passed | passed | passed | passed |
| Molding | passed | passed | passed | passed | passed | passed | passed | passed | passed |
| Heat resistance | 0/20 | 0/20 | 0/20 | 0/20 | 0/20 | 0/20 | 0/20 | 0/20 | 0/20 |

TABLE 6

| | Comparative Example | | | | | | | | |
|---|---|---|---|---|---|---|---|---|---|
| | 19 | 20 | 21 | 22 | 23 | 24 | 25 | 26 | 27 |
| Composition (pbw) | | | | | | | | | |
| Epoxy resin (1) | 46.5 | 46.5 | 57.6 | 30.3 | 45.8 | 57.8 | — | — | 49.8 |
| Epoxy resin (4) | — | — | — | — | — | — | 46.5 | — | — |
| Epoxy resin (5) | — | — | — | — | — | — | — | 53 | — |
| Curing agent (1) | 53.5 | 53.5 | 42.4 | 69.7 | — | — | 53.5 | 47 | 44 |
| Curing agent (2) | — | — | — | — | 54.2 | — | — | — | — |
| Curing agent (3) | — | — | — | — | — | 42.2 | — | — | — |
| Brominated epoxy resin (6) | — | — | — | — | — | — | — | — | 6.2 |
| Molar ratio (epoxy/OH) | 0.8 | 0.8 | 1.2 | 0.4 | 0.8 | 0.8 | 0.8 | 0.8 | 1.05 |
| Antimony trioxide | — | — | — | — | — | — | — | — | 8 |
| Fused silica content (wt %) | 86 | 93 | 89 | 89 | 89 | 89 | 89 | 89 | 89 |
| Carbon black | 2 | 2 | 2 | 2 | 2 | 2 | 2 | 2 | 2 |
| Organic phosphine oxide (3) | 3 | 1 | 5 | 3 | 3 | 3 | 3 | 3 | — |
| Silane coupling agent (1) | 1.5 | 1.5 | 1.5 | 1.5 | 1.5 | 1.5 | 1.5 | 1.5 | 1.5 |
| Kao Wax EBF | 1.2 | 1.2 | 1.2 | 1.2 | 1.2 | 1.2 | 1.2 | 1.2 | 1.2 |
| Triphenylphosphine | 1 | 1 | 1 | 1 | 1 | 1 | 1 | 1 | 1 |
| Properties | | | | | | | | | |
| Spiral flow (cm) | 130 | 11 | 129 | 52 | 108 | 64 | 47 | 91 | 92 |
| UL-94 V-0 | rejected | UM | rejected | passed | rejected | rejected | passed | rejected | passed |
| Molding | passed | rejected | passed | rejected | passed | passed | rejected | passed | passed |
| Heat resistance | — | — | — | — | — | — | — | — | 20/20 |

Examples 28–34 and Comparative Examples 28–36

Epoxy resin compositions were prepared by uniformly melt mixing the components shown in Tables 7 and 8 in a hot twin-roll mill. The release agents used are shown below.

Release agent:

(1) Kao Wax EBF, Kao K.K.
 mp 144° C.

$e = 14-17$ (2) Stearamide, Kanto Chemical K.K.
 mp 109° C.

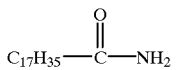

The thus obtained epoxy resin compositions were subjected to the tests (i) to (iii) and (v). The results are shown in Tables 7 and 8.

TABLE 7

| | Example | | | | | | |
|---|---|---|---|---|---|---|---|
| | 28 | 29 | 30 | 31 | 32 | 33 | 34 |
| Composition (pbw) | | | | | | | |
| Epoxy resin (1) | 43.2 | 46.5 | 46.5 | 46.5 | 46.5 | — | — |
| Epoxy resin (2) | — | — | — | — | — | 46.7 | — |
| Epoxy resin (3) | — | — | — | — | — | — | 46.7 |
| Curing agent (1) | 56.8 | 53.5 | 53.5 | 53.5 | 53.5 | 53.3 | 53.3 |
| Molar ratio (epoxy/OH) | 0.7 | 0.8 | 0.8 | 0.8 | 0.8 | 0.8 | 0.8 |
| Fused silica content (wt %) | 90 | 89 | 90 | 90 | 92 | 90 | 90 |
| Carbon black | 2 | 2 | 2 | 2 | 2 | 2 | 2 |
| Silane coupling agent (1) | 1.5 | 1.5 | 1.5 | 1.5 | 1.5 | 1.5 | 1.5 |
| Kao Wax EBF | 1.2 | 1.2 | 1.2 | — | 1.2 | 1.2 | 1.2 |
| Stearamide | — | — | — | 1.2 | — | — | — |
| Triphenylphosphine | 1 | 1 | 1 | 1 | 1 | 1 | 1 |
| Properties | | | | | | | |
| Spiral flow (cm) | 67 | 85 | 71 | 73 | 62 | 83 | 88 |
| UL-94 V-0 | passed | passed | passed | passed | passed | passed | passed |
| Molding | passed | passed | passed | passed | passed | passed | passed |
| Heat resistance | 0/20 | 0/20 | 0/20 | 0/20 | 0/20 | 0/20 | 0/20 |

TABLE 8

| | Comparative Example | | | | | | | | |
|---|---|---|---|---|---|---|---|---|---|
| | 28 | 29 | 30 | 31 | 32 | 33 | 34 | 35 | 36 |
| Composition (pbw) | | | | | | | | | |
| Epoxy resin (1) | 46.5 | 46.5 | 57.6 | 30.3 | 45.8 | 57.8 | — | — | 49.8 |
| Epoxy resin (4) | — | — | — | — | — | — | 46.5 | — | — |
| Epoxy resin (5) | — | — | — | — | — | — | — | 53 | — |
| Curing agent (1) | 53.5 | 53.5 | 42.4 | 69.7 | — | — | 53.5 | 47 | 44 |
| Curing agent (2) | — | — | — | — | 54.2 | — | — | — | — |
| Curing agent (3) | — | — | — | — | — | 42.2 | — | — | — |
| Brominated epoxy resin (6) | — | — | — | — | — | — | — | — | 6.2 |
| Molar ratio (epoxy/OH) | 0.8 | 0.8 | 1.2 | 0.4 | 0.8 | 0.8 | 0.8 | 0.8 | 1.05 |
| Antimony trioxide | — | — | — | — | — | — | — | — | 8 |
| Fused silica content (wt %) | 88 | 93 | 90 | 90 | 90 | 90 | 90 | 90 | 90 |
| Carbon black | 2 | 2 | 2 | 2 | 2 | 2 | 2 | 2 | 2 |
| Silane coupling agent (1) | 1.5 | 1.5 | 1.5 | 1.5 | 1.5 | 1.5 | 1.5 | 1.5 | 1.5 |
| Kao Wax EBF | 1.2 | 1.2 | 1.2 | 1.2 | 1.2 | 1.2 | 1.2 | 1.2 | 1.2 |
| Triphenylphosphine | 1 | 1 | 1 | 1 | 1 | 1 | 1 | 1 | 1 |
| Properties | | | | | | | | | |
| Spiral flow (cm) | 110 | 7 | 75 | 41 | 60 | 53 | 33 | 73 | 80 |
| UL-94 V-0 | rejected | UM | rejected | passed | rejected | rejected | passed | rejected | passed |
| Molding | passed | rejected | passed | rejected | passed | passed | rejected | passed | passed |
| Heat resistance | — | — | — | — | — | — | — | — | 20/20 |

Examples 35–42 and Comparative Examples 37–46

Epoxy resin compositions were prepared by uniformly melt mixing the components shown in Tables 9 and 10 in a hot twin-roll mill. The silane coupling agents used are shown below.

Silane coupling agent:

(1) KBM-573, Shin-Etsu Chemical Co., Ltd.
 bp 312° C.

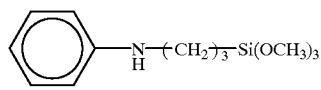

(2) KBM-803, Shin-Etsu Chemical Co., Ltd.
 bp 219° C.
 HS—(CH$_2$)$_3$—Si(OCH$_3$)$_3$ (3)

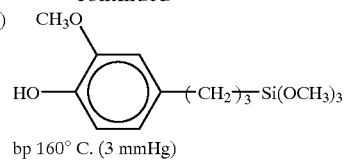

bp 160° C. (3 mmHg)

The thus obtained epoxy resin compositions were subjected to the tests (i), (ii), (iii) and (v) and an adhesion test (vi). The results are shown in Tables 9 and 10.

(vi) Adhesion test

An epoxy resin composition was molded on a 42 alloy plate at 175° C. and 70 kg/cm$^2$ for 2 minutes and post cured at 180° C. for 4 hours, forming a resin disc having a diameter of 15 mm and a height of 5 mm on the plate. The sample was allowed to stand at 121° C. and 2.1 atmospheres for 24 hours and then immersed in vapor phase reflow at 215° C. for one minute. Using a push-pull gage, a force necessary to peel the disc from the plate was measured.

TABLE 9

| | Example | | | | | | | |
|---|---|---|---|---|---|---|---|---|
| | 35 | 36 | 37 | 38 | 39 | 40 | 41 | 42 |
| Composition (pbw) | | | | | | | | |
| Epoxy resin (1) | 43.2 | 46.5 | 46.5 | 46.5 | 46.5 | 46.5 | — | — |
| Epoxy resin (2) | — | — | — | — | — | — | 46.7 | — |
| Epoxy resin (3) | — | — | — | — | — | — | — | 46.7 |
| Curing agent (1) | 56.8 | 53.5 | 53.5 | 53.5 | 53.5 | 53.5 | 53.3 | 53.3 |
| Molar ratio (epoxy/OH) | 0.7 | 0.8 | 0.8 | 0.8 | 0.8 | 0.8 | 0.8 | 0.8 |
| Fused silica content (wt %) | 90 | 89 | 90 | 90 | 90 | 92 | 90 | 90 |
| Carbon black | 2 | 2 | 2 | 2 | 2 | 2 | 2 | 2 |
| Silane coupling agent (1) | 1.5 | 1.5 | 1.5 | — | — | 1.5 | 1.5 | 1.5 |
| Silane coupling agent (2) | — | — | — | 1.5 | — | — | — | — |
| Silane coupling agent (3) | — | — | — | — | 1.5 | — | — | — |
| Kao Wax EBF | 1.2 | 1.2 | 1.2 | 1.2 | 1.2 | 1.2 | 1.2 | 1.2 |
| Triphenylphosphine | 1 | 1 | 1 | 1 | 1 | 1 | 1 | 1 |
| Properties | | | | | | | | |
| Spiral flow (cm) | 67 | 85 | 71 | 76 | 65 | 62 | 83 | 88 |
| Bond force (kg) | 24 | 28 | 27 | 27 | 29 | 26 | 32 | 25 |
| UL-94 V-0 | passed | passed | passed | passed | passed | passed | passed | passed |
| Molding | passed | passed | passed | passed | passed | passed | passed | passed |
| Heat resistance | 0/20 | 0/20 | 0/20 | 0/20 | 0/20 | 0/20 | 0/20 | 0/20 |

TABLE 10

| | Comparative Example | | | | | | | | | |
|---|---|---|---|---|---|---|---|---|---|---|
| | 37 | 38 | 39 | 40 | 41 | 42 | 43 | 44 | 45 | 46 |
| Composition (pbw) | | | | | | | | | | |
| Epoxy resin (1) | 46.5 | 46.5 | 57.6 | 30.3 | 46.5 | 45.8 | 57.8 | — | — | 49.8 |
| Epoxy resin (4) | — | — | — | — | — | — | — | 46.5 | — | — |
| Epoxy resin (5) | — | — | — | — | — | — | — | — | 53 | — |
| Curing agent (1) | 53.5 | 53.5 | 42.4 | 69.7 | 53.5 | — | — | 53.5 | 47 | 44 |
| Curing agent (2) | — | — | — | — | — | 54.2 | — | — | — | — |
| Curing agent (3) | — | — | — | — | — | — | 42.2 | — | — | — |
| Brominated epoxy resin (6) | — | — | — | — | — | — | — | — | — | 6.2 |
| Molar ratio (epoxy/OH) | 0.8 | 0.8 | 1.2 | 0.4 | 0.8 | 0.8 | 0.8 | 0.8 | 0.8 | 1.05 |

TABLE 10-continued

| | Comparative Example | | | | | | | | | |
|---|---|---|---|---|---|---|---|---|---|---|
| | 37 | 38 | 39 | 40 | 41 | 42 | 43 | 44 | 45 | 46 |
| Antimony trioxide | — | — | — | — | — | — | — | — | — | 8 |
| Fused silica content (wt %) | 88 | 93 | 90 | 90 | 90 | 90 | 90 | 90 | 90 | 90 |
| Carbon black | 2 | 2 | 2 | 2 | 2 | 2 | 2 | 2 | 2 | 2 |
| Silane coupling agent (1) | 1.5 | 1.5 | 1.5 | 1.5 | — | 1.5 | 1.5 | 1.5 | 1.5 | 1.5 |
| Kao Wax EBF | 1.2 | 1.2 | 1.2 | 1.2 | 1.2 | 1.2 | 1.2 | 1.2 | 1.2 | 1.2 |
| Triphenylphosphine | 1 | 1 | 1 | 1 | 1 | 1 | 1 | 1 | 1 | 1 |
| Properties | | | | | | | | | | |
| Spiral flow (cm) | 110 | 7 | 75 | 41 | 72 | 60 | 53 | 33 | 73 | 80 |
| Bond force (kg) | 29 | UM | 32 | 12 | 2 | 36 | 24 | 26 | 35 | 31 |
| UL-94 V-0 | rejected | UM | rejected | passed | passed | rejected | rejected | passed | rejected | passed |
| Molding | passed | rejected | passed | rejected | passed | passed | passed | rejected | passed | passed |
| Heat resistance | — | — | — | — | 0/20 | — | — | — | — | 20/20 |

Although some preferred embodiments have been described, many modifications and variations may be made thereto in the light of the above teachings. It is therefore to be understood that within the scope of the appended claims, the invention may be practiced otherwise than as specifically described.

What is claimed is:

1. A semiconductor encapsulating epoxy resin composition comprising
   (A) an epoxy resin which is crystalline and exhibits a viscosity of lower than 80 centipoise at 25° C. when measured as a solution thereof in meta-cresol in a concentration of 30% by weight,
   (B) a curing agent having at least two phenolic hydroxyl groups in a molecule, the curing agent not containing monovalent to tetravalent saturated aliphatic hydrocarbon structures having at least 3 carbon atoms, and being present in such an amount that the molar ratio of the epoxy group in the epoxy resin to the phenolic hydroxyl group in the curing agent ranges from 5/10 to 9/10,
   (C) 86 to 95% by weight of the entire composition of silica, and
   (D) an organopolysiloxane in an amount of 0.1 to 5 parts by weight per 100 parts by weight of the epoxy resin and the curing agent combined, said organopolysiloxane (D) being of the following average compositional formula (1):

$$R^1_a SiO_{(4-a)/2} \quad (1)$$

wherein $R^1$ is an unsubstituted monovalent hydrocarbon group or a monovalent hydrocarbon group having one or more substituents independently selected from the group consisting of a halogen atom, cyano group, hydroxy group, alkoxy group, amino group, mercapto group, imino group, epoxy group, carboxyl group, carbinol group, (methyl)styryl group, (meth)acryl group, polyether group, fatty acid group, fatty acid ester group, and long chain alkyl group having at least 14 carbon atoms, and a is a positive number from 0.8 to 3, wherein said organopolysiloxane (D) has a linear, cyclic, branched or three-dimensional structure and a degree of polymerization of about 5 to about 10000, and wherein said organopolysiloxane (D) is not cured by a curing agent, with the provisos that
   (1) said composition does not contain flame retardants selected from the group consisting of antimony compounds and bromine compounds, and
   (2) the cured product of said composition gives a flame retardance rating UL-94 V-0.

2. The composition of claim 1 further comprising
   (E) an organic phosphine oxide of the following general formula (2):

$$(O{=}PR^2_3)_n \quad (2)$$

wherein $R^2$ is independently an unsubstituted monovalent hydrocarbon group or a monovalent hydrocarbon group having one or more substituents independently selected from the group consisting of halogen, cyano, hydroxy, alkoxy and ester, or two $R^2$ groups, taken together, forms a cyclic structure and letter n is equal to 1, 2 or 3.

3. The composition of claim 1 or 2 further comprising (F) an amide group-containing release agent.

4. The composition of claim 3 wherein the amide group-containing release agent (F) is of the following general formula (3) or (4):

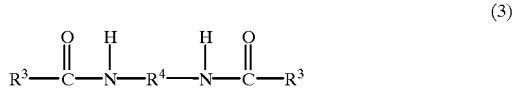

(3)

(4)

wherein $R^3$ is a monovalent hydrocarbon group of 10 to 30 carbon atoms, $R^4$ is a divalent hydrocarbon group of 1 to 4 carbon atoms, and $R^5$ is a hydrogen atom or monovalent hydrocarbon group of 10 to 30 carbon atoms.

5. The composition of claim 1, further comprising (G) a silane coupling agent free of an epoxy group.

6. The composition of claim 5 wherein the silane coupling agent (G) is of the following general formula (5):

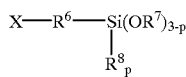 (5) 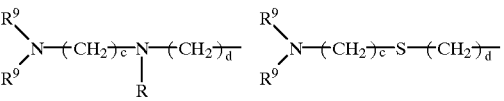

wherein X is a monovalent functional group selected from the group consisting of hydroxyl, thiol, amino, and —N($R^9$)$_2$, wherein $R^9$ may be the same or different and is selected from the group consisting of a hydrogen atom and a monovalent hydrocarbon group having 1 to 15 carbon atoms, $R^6$ is an unsubstituted divalent hydrocarbon group of 1 to 15 carbon atoms or a divalent hydrocarbon group of 1 to 15 carbon atoms having at least one element intervening in an alkylene chain, said intervening element being selected from the group consisting of oxygen, sulfur, thioether group, —NH—, and —N($R^9$)—, wherein $R^9$ is the same as defined above, and wherein —X— $R^6$ may be a monovalent group having an alkylene diamino structure or alkylene thioamino structure of the following formulae:

wherein c and d are integers, c is at least 1, d is at least 1, and the sum of c and d is from 2 to 15, $R^7$ and $R^8$ are independently monovalent hydrocarbon groups of 1 to 6 carbon atoms, and letter p is equal to 0, 1 or 2.

7. The composition of claim 1, wherein the epoxy resin does not contain a monovalent to tetravalent saturated aliphatic hydrocarbon structure having at least 3 carbon atoms in a molecule except for a closed or open ring glycidyl group, and the curing agent does not contain a monovalent to tetravalent saturated aliphatic hydrocarbon structure having at least 3 carbon atoms in a molecule.

8. A semiconductor device encapsulated with a cured product of the epoxy resin composition of claim 1.

9. The composition of claim 1, wherein the epoxy resin (A) is a biphenyl epoxy resin of the following formula:

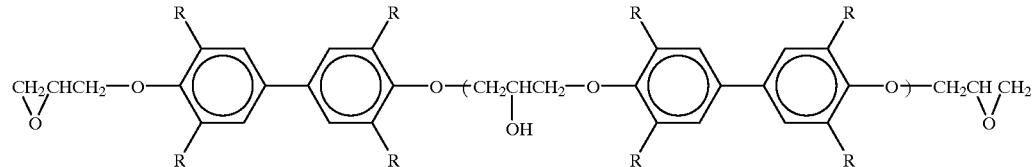

wherein R is hydrogen or methyl and letter b is an integer of 0 to 3, and the curing agent (B) is a phenol aralkyl resin selected from the group consisting of the following formulae:

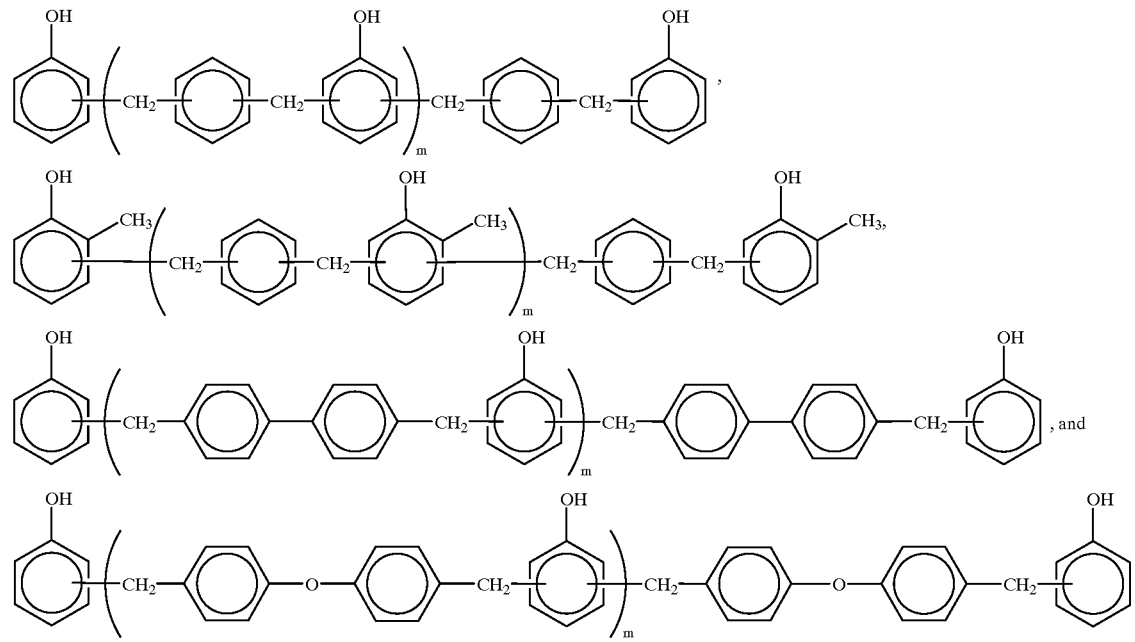

wherein m is an integer of 0 to 3.
10. The composition of claim 1, wherein the organopolysiloxane compound (D) is at least one selected from the group consisting of the following formulae:
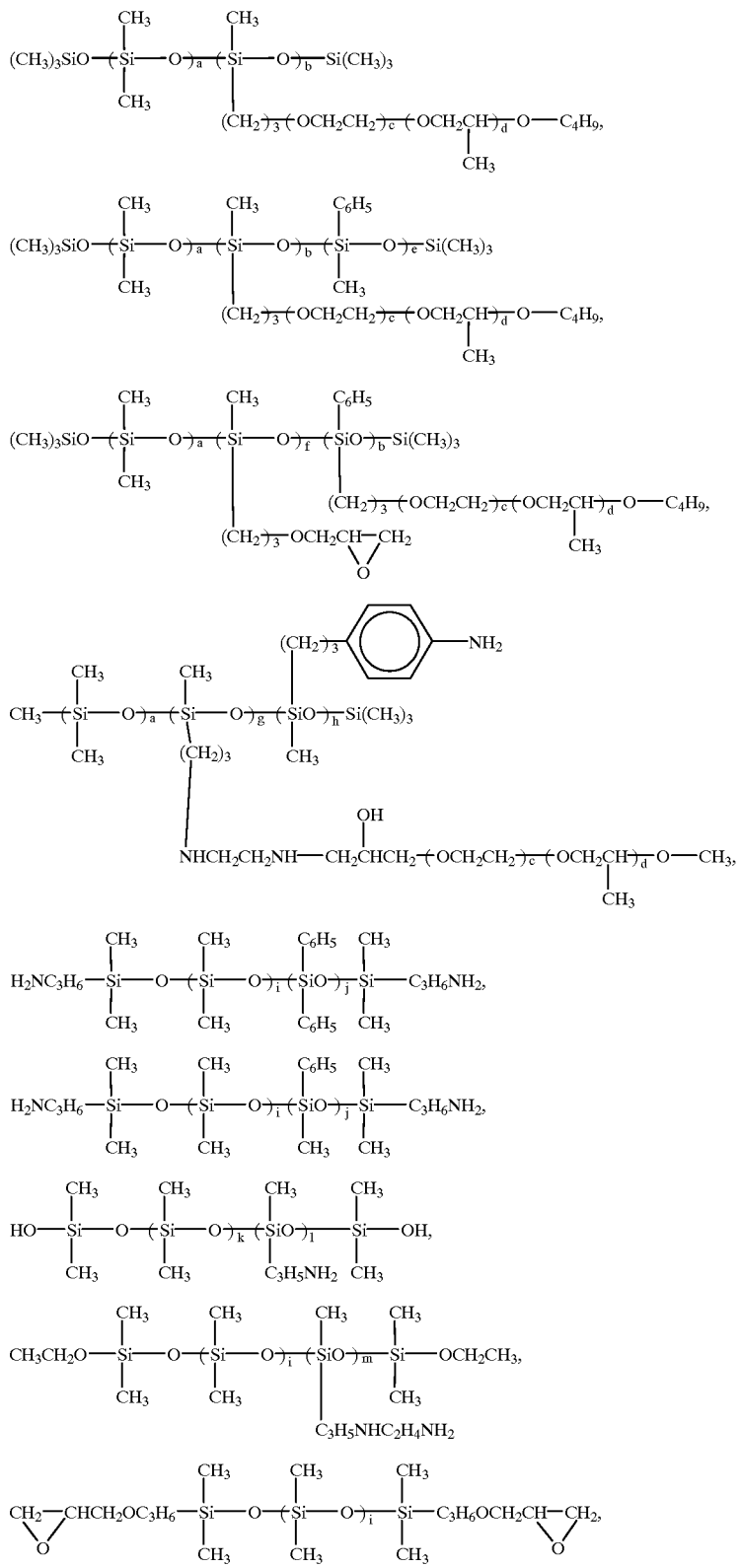

-continued
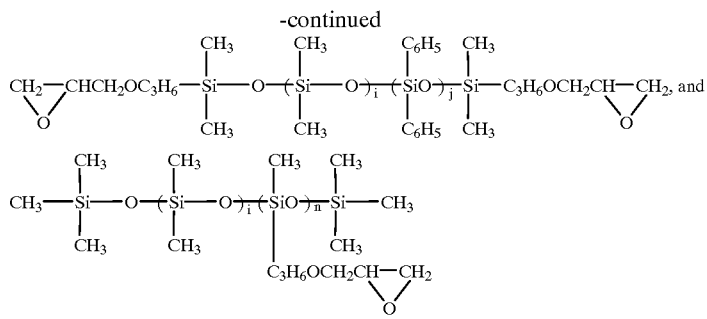
wherein a is 5 to 200, b is 1 to 5, c is 0 to 30, d is 0 to 30, the sum of c and d is 10 to 60, e is 1 to 50, f is 1 to 5, g is 1 to 5, h is 0 to 5, i is 5 to 200, j is 1 to 50, k is 50 to 2000, l is 1 to 10, m is 1 to 10, and n is 1 to 10.
11. The composition of claim 2, wherein the organic phosphine oxide compound (E) is at least one selected from the group consisting of the following formulae:
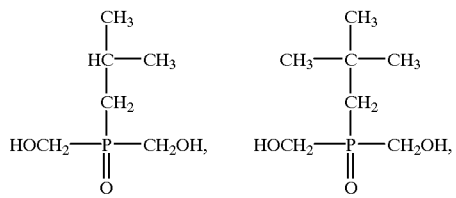
-continued
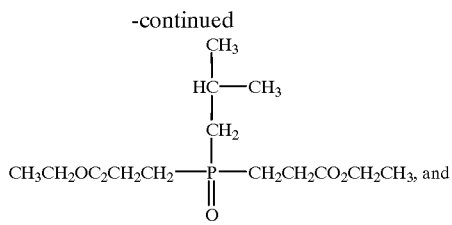
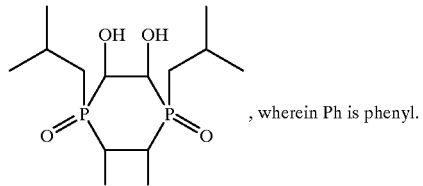
, wherein Ph is phenyl.
* * * * *